United States Patent
Uchiyama

(10) Patent No.: US 6,617,756 B1
(45) Date of Patent: Sep. 9, 2003

(54) PIEZO-OSCILLATOR

(75) Inventor: Toshikazu Uchiyama, Kouza-gun (JP)

(73) Assignee: Toyo Communication Equipment Co., Ltd., Kanagawa (JP)

(*) Notice: Subject to any disclaimer, the term of this patent is extended or adjusted under 35 U.S.C. 154(b) by 0 days.

(21) Appl. No.: 09/762,846

(22) PCT Filed: Jun. 12, 2000

(86) PCT No.: PCT/JP00/03807

§ 371 (c)(1),
(2), (4) Date: Feb. 9, 2001

(87) PCT Pub. No.: WO00/79677

PCT Pub. Date: Dec. 28, 2000

(30) Foreign Application Priority Data

Jun. 18, 1999 (JP) ............................................. 11-173303

(51) Int. Cl.⁷ ............................................... H01L 41/09
(52) U.S. Cl. ......................................................... 310/317
(58) Field of Search ......................................... 310/317

(56) References Cited

U.S. PATENT DOCUMENTS 4,142,161 A * 2/1979 Gray ........................... 310/370
4,193,046 A * 3/1980 Chiba .......................... 331/109
5,126,695 A * 6/1992 Abe ............................. 331/158
6,304,152 B1 * 10/2001 Takahashi et al. ...... 331/116 FE

FOREIGN PATENT DOCUMENTS

| JP | H6-164241 | 6/1994 | ............ H03B/5/32 |
| JP | H8-204450 | 8/1996 | ............ H03B/5/32 |
| JP | 9-36661 A | * 2/1997 | ............ H03B/5/00 |
| JP | 1-300604 A | * 12/1999 | ............ H03B/5/00 |

* cited by examiner

Primary Examiner—Thomas M. Dougherty
(74) Attorney, Agent, or Firm—Koda & Androlia

(57) ABSTRACT

In order to realize a small quartz oscillator having high frequency stability and capable of measuring DLD characteristics, in a piezo-oscillator comprising an oscillator circuit including a piezo-vibrator and an amplifier circuit, and a constant-voltage circuit, in which a power source and the oscillator circuit are connected through the constant-voltage circuit to supply a constant voltage to the oscillator circuit, depending on the said power source voltage, a function of the constant-voltage circuit is invalidated. With this structure, even after the piezo-vibrator and other electron circuits are integrally assembled, it is possible to adjust the drive level of the quartz vibrator and to measure the DLD characteristics by changing the power source voltage.

13 Claims, 5 Drawing Sheets (a)

(b)

PIEZO-OSCILLATOR

TECHNICAL FIELD

The present invention relates to a piezo-oscillator, and more particularly, to a small piezo-oscillator having excellent aging characteristics.

BACKGROUND TECHNIQUE

In recent years, as communications equipment is reduced in size, a reference signal source used for the equipment is required to be small in size, and a quartz oscillator shown in FIG. 5 for example has been proposed.

FIG. 5(a) is a sectional view of a structure of a conventional quartz oscillator, and FIG. 5(b) is a circuit diagram of the conventional quartz oscillator.

As shown in FIG. 5(a), the quartz oscillator 100 includes an integrated amplifier circuit 101, a quartz vibrator 102, a ceramic container 103 having a recess for accommodating the amplifier circuit 101 and the quartz vibrator 102 therein, and a metal lid 104. After the amplifier circuit 101 is mounted in on a bottom surface of the recess of the ceramic container 103, the quartz vibrator 102 is mounted such as to cover an upper surface of the amplifier circuit 101, and the ceramic container 103 is sealed by the lid 104 such as to cover these members.

The quartz vibrator 102 and other electron parts are mounted in the common accommodation container in this manner, thereby realizing a compact quartz oscillator 100.

However, with the above structure, it is impossible to check a drive level dependence characteristics (DLD characteristics, hereinafter) such as variation in oscillation frequency with respect to drive level variation of the quartz vibrator 102.

That is, the DLD characteristics may be varied due to variation in producing procedure and producing conditions or the like.

Since the DLD characteristics affects the stability of frequency and characteristics and reproducibility of the quartz vibrator 102, it is indispensable to check the vibrator after it was completed.

A common method for checking the DLD characteristics of the quartz vibrator 102 is to change the drive level of the quartz vibrator 102 incorporated in the oscillator, and to check deviation of oscillation frequency with respect to variation of the drive level.

In the case of the quartz oscillator 100, since the quartz vibrator 102 and the amplifier circuit 101 are accommodated in the same container, the quartz vibrator 102 alone can not be checked. It seems possible to control a voltage value of a power source Vcc to be supplied to the oscillator circuit of the quartz oscillator 100, thereby adjusting the amplification action of the amplifier circuit 101 to control the drive level of the quartz vibrator 102.

However, since the quartz oscillator 100 output stable frequency signal even if the supplied power source voltage is varied, at least one of a constant-voltage circuit 105 and a constant-current circuit 106 is provided in the oscillator circuit as shown in FIG. 5(b) in many cases.

Therefore, in the case of the quartz oscillator 100 having such a structure, even if the power source voltage value is controlled, since the drive level of the quartz vibrator 102 is not varied, there is a problem that DLD characteristics can not be checked.

The present invention has been accomplished to solve the above problems of the conventional constant-voltage oscillator, and it is an object of the invention to provided a small quartz oscillator in which the DLD characteristics can be measured after it is packaged even if a constant-voltage circuit or constant-current circuit is included in the circuit.

DISCLOSURE OF THE INVENTION

To achieve the above object, according to the invention described in a first aspect, there is provided a piezo-oscillator comprising an oscillator circuit including a piezo-vibrator and an amplifier circuit, and a constant-voltage circuit, in which a power source and the oscillator circuit are connected through the constant-voltage circuit to supply a constant voltage to the oscillator circuit, wherein when a voltage of the power source is equal to or higher than a predetermined value, a function of the constant-voltage circuit is invalidated.

According to a second aspect, there is provided a piezo-oscillator comprising a piezo-oscillator including a piezo-vibrator, an amplifier circuit and a constant-current circuit, wherein when a voltage of the power source is equal to or higher than a predetermined value, a function of the constant-current circuit is invalidated.

According to a third aspect, there is provided a piezo-oscillator comprising an oscillator circuit including a piezo-vibrator and an amplifier circuit, a constant-voltage circuit and frequency control voltage section, in which a power source and the oscillator circuit are connected through the constant-voltage circuit to supply a constant voltage to the oscillator circuit, wherein when a voltage to be supplied to the frequency control voltage section is equal to or higher than a predetermined value, a function of the constant-voltage circuit is invalidated.

According to a fourth aspect, there is provided a piezo-oscillator comprising a piezo-oscillator including a piezo-vibrator, an amplifier circuit, a constant-current circuit and a frequency control voltage section, wherein when a voltage to be supplied to the frequency control voltage section is equal to or higher than a predetermined value, a function of the constant-current circuit is invalidated.

According to a fifth aspect, in addition to the first or the third aspect, within in a voltage range in which the function of the constant-voltage circuit is invalidated, the power source voltage is controlled, and a drive level of the piezo-vibrator is controlled by changing a voltage to be supplied to the amplifier circuit.

According to a sixth aspect, in addition to the second or the fourth aspect, within in a voltage range in which the function of the constant-voltage circuit is invalidated, the power source voltage is controlled, and a drive level of the piezo-vibrator is controlled by changing a voltage to be supplied to the amplifier circuit.

According to a seventh aspect, in addition to the fifth or the sixth aspect, it is possible to confirm drive level dependency characteristics of the piezo-vibrator by controlling a drive level of the piezo-vibrator.

According to an eighth aspect, there is provided a piezo-oscillator comprising an oscillator circuit including a piezo-vibrator and an amplifier circuit for supplying electric power to the oscillator circuit through a constant-voltage circuit or a constant-current circuit, wherein the constant-voltage circuit or the constant-current circuit is provided with a current bypass switch, a function of the constant-voltage circuit or the constant-current circuit is invalidated by controlling the switch from outside.

BEST MODE FOR CARRYING OUT THE INVENTION

The present invention will be explained in detail based on the illustrated embodiments.

Figure 1:
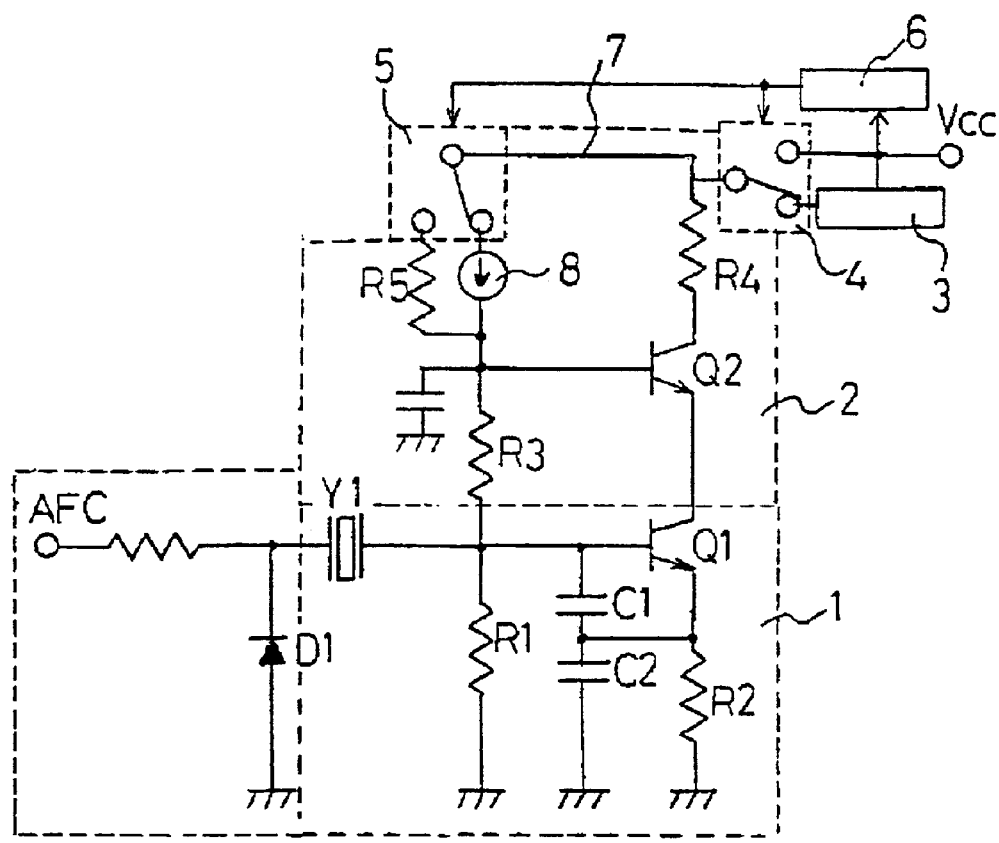
FIG. 1 is a circuit diagram of an embodiment of a quartz oscillator based on the present invention.

FIG. 1 is a circuit diagram of an embodiment of a quartz oscillator based on the present invention.

A circuit shown in FIG. 1 has a structure in which an amplifier circuit 2 is cascaded to a typical Colpitts quartz oscillator 1. A power source Vcc, the amplifier circuit 2 and a constant-voltage circuit 3 are connected through a switch circuit 4. The switch circuit 4, a switch circuit 5 (which will be described later) included in the amplifier circuit 2 are connected to a control circuit 6 for controlling theses witch circuits.

In the oscillator circuit 1, a resistor R1 is connected between a ground and a base of a transistor Q1 that is an amplifier element. A capacitor C1 is connected between the base and an emitter, and a capacitor C2 between the emitter and the ground. A resistor R2 is connected in parallel to the capacitor C2. A resistor R3 is connected between the base of the transistor Q1 cascaded to the amplifier circuit 2 and a base of a transistor Q2.

In the amplifier circuit 2, in addition to the above-explained connection relation, a power source line 7 and a collector of the transistor Q2 are connected through a resistor R4, and a constant-current circuit 8 and a resistor R5 are connected to the base of the transistor Q2, and the amplifier circuit 2 is structured such that any of them is connected to the power source line 7 by the switch circuit 5.

The power source line 7 is structured such that the power source line 7 is connected any one of the constant-voltage circuit 4 and the power source Vcc by the switch circuit 4.

Figure 2:
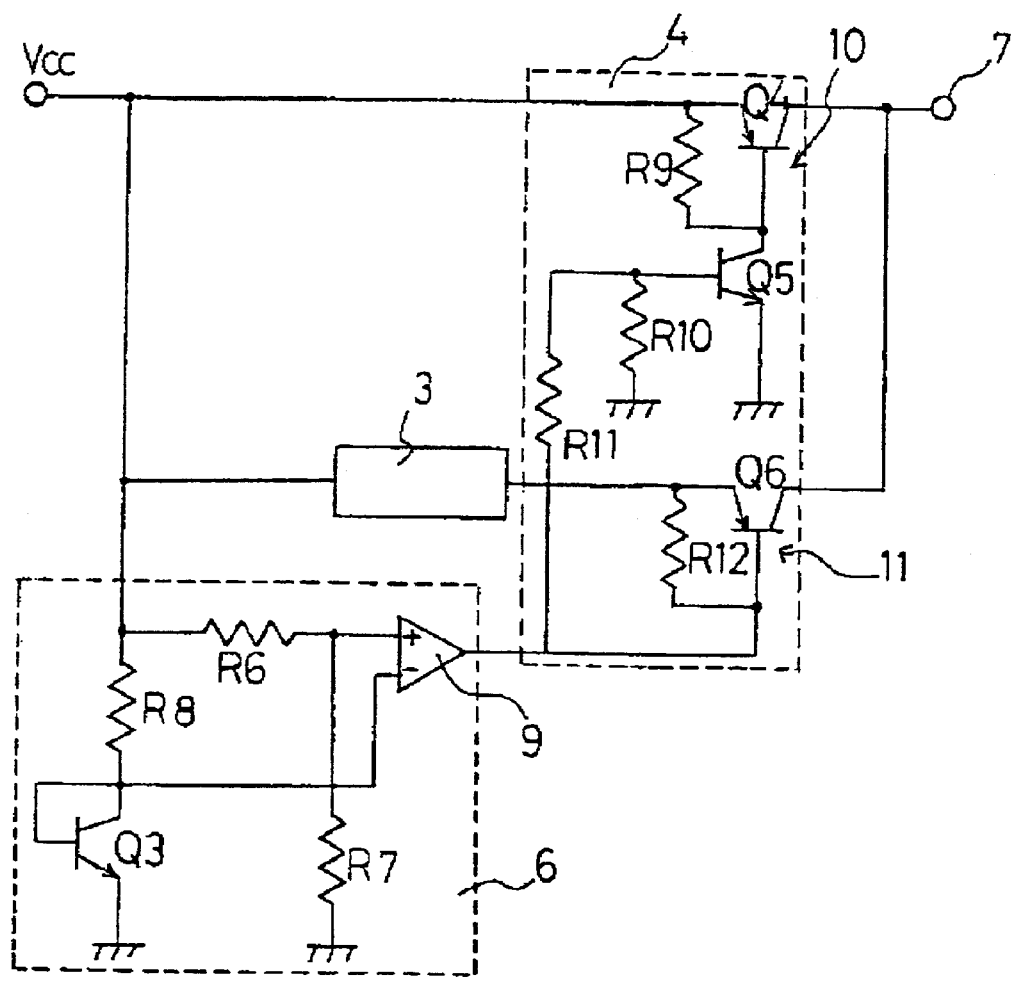
FIG. 2 is a circuit diagram of a control circuit of the quartz oscillator based on the invention.

FIG. 2 is a circuit diagram showing one example of the control circuit 6. Control of the switch circuit 4 is mainly explained.

As shown in FIG. 2, the control circuit 6 includes a voltage comparing section 9. The control circuit 6 outputs a signal to the switch circuit 4 as a control signal, and controls a switch 10 and a switch 11 provided in the switch circuit 4.

A positive terminal of the voltage comparing section 9 of the control circuit 6 is connected to the power source Vcc divided by a resistor R6 and a resistor R7 so as to supply voltage. A collector and a base of a transistor Q3 are connected, and a negative terminal of the voltage comparing section 9 is connected to the collector. As a result, the power source Vcc is supplied to the other negative terminal via a resistor R8.

An emitter of a PNP transistor Q4 (transistor Q4, hereinafter) of the switch 10 connects to the power source Vcc, and a collector of the transistor Q4 connects to the voltage comparing section 9 of the control circuit 6. The emitter of the transistor Q4 connects to the base through a resistor R9, and the base connects to a collector of a transistor Q5 whose emitter is grounded. The base of the transistor Q5 is also grounded via a resistor R10, and connected to an output terminal of the comparing section 9 through a resistor R11.

An emitter of a PNP transistor Q6 (transistor Q6, hereinafter) of the switch 11 connects to an output terminal of the constant-voltage circuit 3. A base of the transistor Q6 connects to an output terminal OP of the control circuit 6. The emitter is connected the base and the output terminal of the comparing section 9 via a resistor R12.

The operation of the control circuit 6 will be explained.

First, in the quartz oscillator, the power source voltage (Vcc) is usually set up in a prescribed range for oscillation, and the voltage at oscillation is defined as operation voltage (Vccd), and voltage higher than Vccd is defined as non-operation voltage (Vcch).

A divided voltage ratio of the resistor R6 and the resistor R7 is set such that when the Vccd is maximum, voltage (voltage between the base and the emitter of the transistor Q3) of the positive terminal and voltage of the negative terminal of the comparator 12 become equal to each other.

Therefore, an output signal of the comparing section 9 becomes LOW and outputs 0V when the Vcc is in the range of Vccd.

At that time, an electric potential of the base of the transistor Q6 becomes lower than that of the emitter and thus, the transistor Q6 is actuated. Further, since the transistor Q5 is not actuated, the transistor Q4 is not actuated, thus the switch 10 is brought into OFF State. As a result, the constant-voltage circuit 3 and the power source line 7 are connected, and the constant-voltage circuit function is functioned.

On the other hand, when the Vcc is equal to or higher than the Vcch, the output signal of the comparing section 9 becomes HI and outputs voltage Vh (voltage Vh>constant-voltage circuit output voltage).

At that time, in the switch 11, since the electric potential of the base of the transistor Q6 becomes higher than that of the emitter, the transistor Q6 is not actuated. In addition, the transistor Q5 of the switch 10 is actuated so that the base of the transistor Q4 is grounded, the transistor Q4 is actuated. As a result, the power source Vcc and the power source line 7 are directly connected to each other and thus, the constant-voltage circuit function becomes invalid.

The switch circuit 5 is operated in the same manner as the switch circuit 4. In the switch circuit 5, when the voltage is in the range of Vccd, the constant-current circuit 8 is connected to the power source line 7, and when the voltage is non-operation voltage Vcch, the resistor R5 is connected to the power source line 7.

According to the above-explained operation, when the operation voltage is 5V±1V, if the voltage of the power source Vcc is 6V or higher, it is possible to invalidate the functions of the constant-voltage circuit 3 and the constant-current circuit 8. Therefore, it is possible to control the operation of the amplifier circuit by the voltage of the power source Vcc without affecting the oscillation when the quartz oscillator is used. Therefore, it is possible to control the drive level of the quartz oscillator and thus, the DLD characteristics can be checked after the package.

Figure 3:
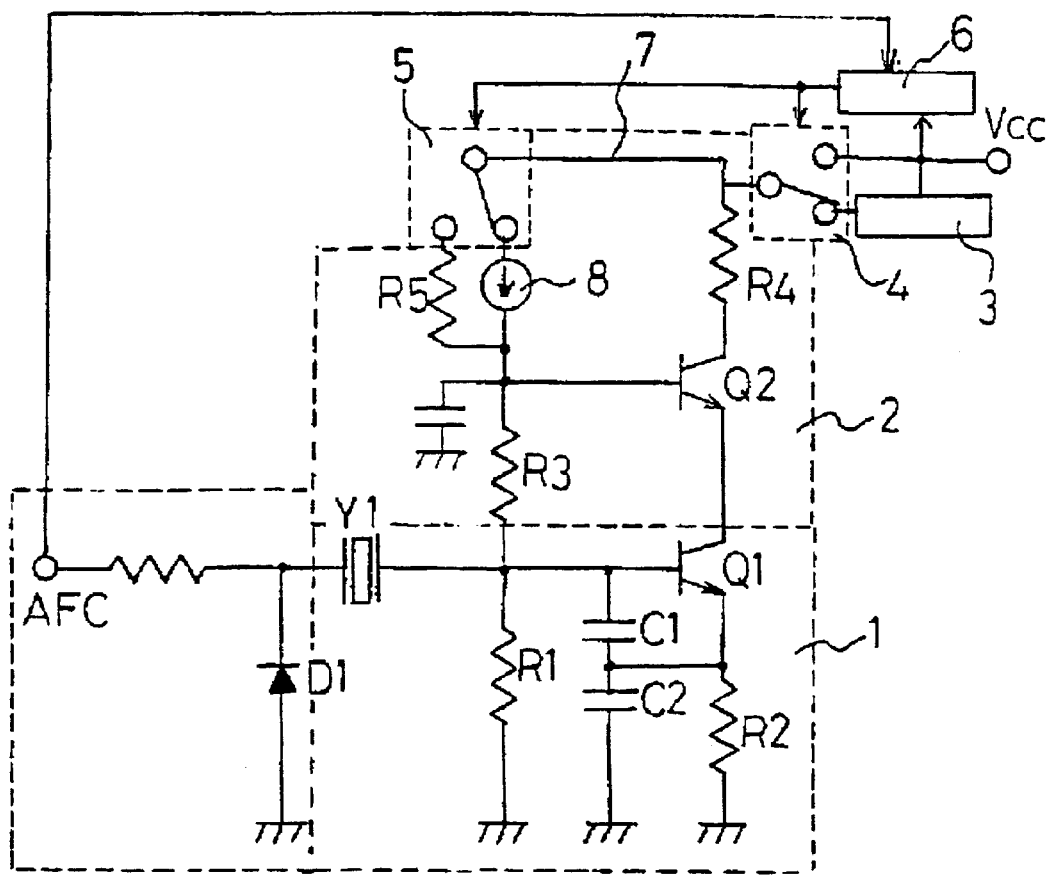
FIG. 3 is a circuit diagram of another embodiment of the of the quartz oscillator based on the invention.

FIG. 3 is a circuit diagram showing another embodiment of the quartz oscillator based on the present invention. FIG.

4 shows an example of circuit structure of the control circuit 6 shown in FIG. 3.

Figure 4:
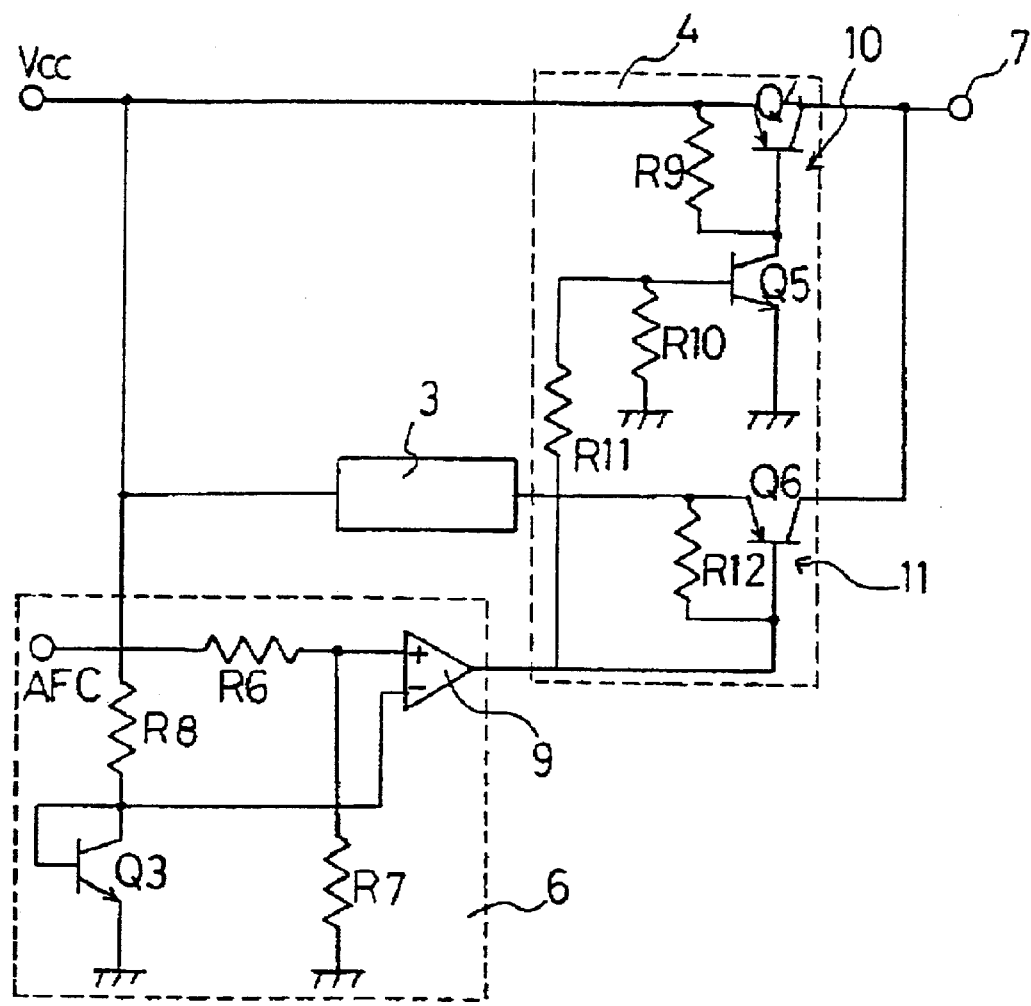
FIG. 4 is a circuit diagram of a control circuit of the quartz oscillator based on the invention.
Figure 5:
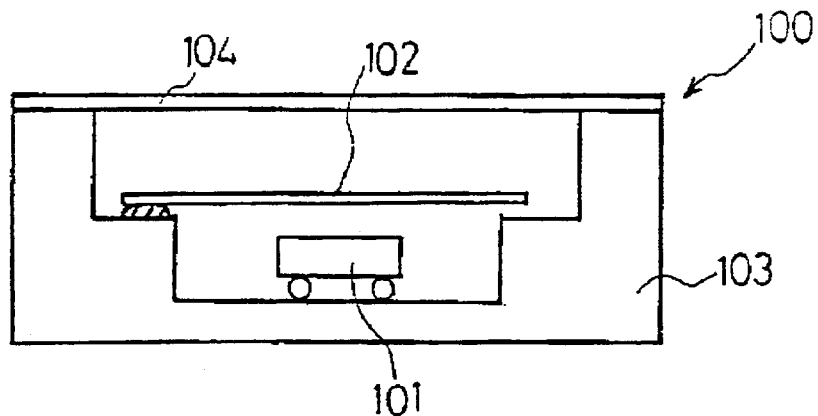
FIG. 5 are views showing structure of a conventional quartz oscillator, wherein (a) is a side sectional view of the conventional quartz oscillator, and (b) is a circuit diagram of the conventional quartz oscillator.
Figure 5:
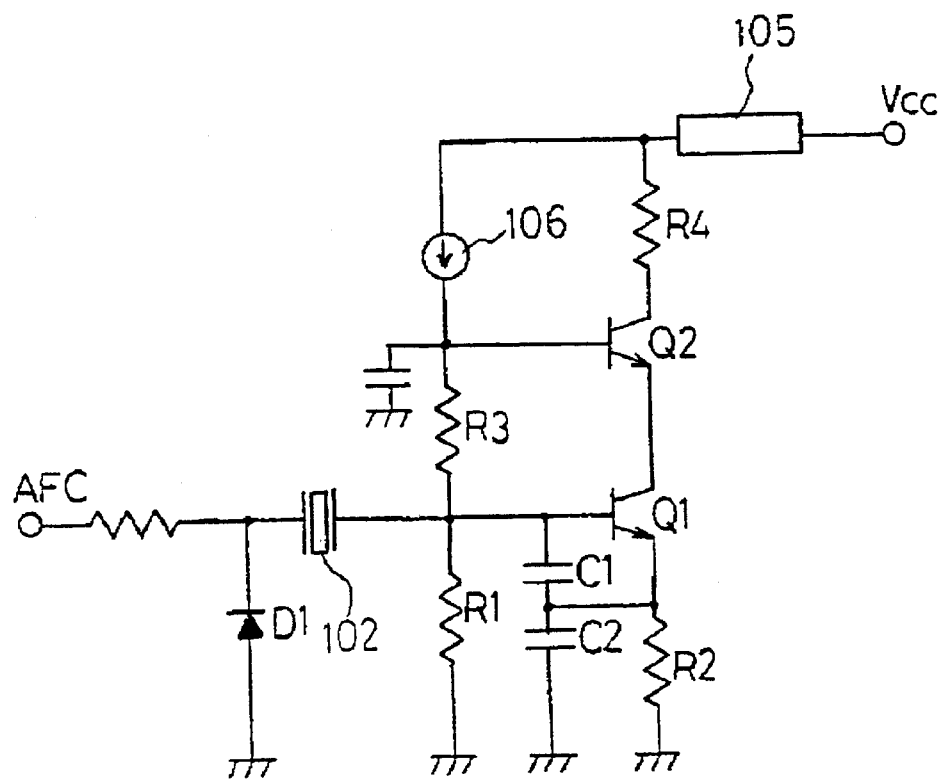

The quartz oscillator circuit shown in FIG. 3 is different from that shown in FIG. 1 in that a frequency control voltage section AFC is connected to the positive terminal of the comparing section 9 as shown in FIG. 4 such that voltage of the frequency control voltage section AFC is supplied to the positive terminal, thereby controlling the switch circuit 4 and the switch circuit 5 by the voltage signal from the frequency control voltage section AFC.

With this arrangement, it is possible to invalidate the functions of the constant-voltage circuit 3 and the constant-current circuit 8 even if the voltage is in a range of the operation voltage Vccd. Therefore, it is possible to control the drive level over a wider range.

Similarly, in the examples shown in FIGS. 1 and 2, it is possible to separately provide a switch control terminal, and to control a circuit that bypasses the constant-voltage circuit and the constant-current circuit irrespective of the power source voltage value.

The present invention has been described while taking a case of the switch circuit constituted using the transistors, but the invention is not limited to this structure, and another switch circuit having a different structure may also be used if the switch circuit performs a switch operation.

The present invention has been explained while taking the case of the oscillator using the quartz elements, the invention is not limited to this, and it is apparent that the invention may be applied to another piezo-oscillator other than quartz oscillator.

In the piezo-oscillator based on the present invention, as explained above, it is possible to invalidate the control of the constant-voltage circuit and the constant-current circuit at operation voltage or higher even if the piezo-vibrator and the oscillator circuit including the constant-voltage circuit and the constant-current circuit are contained in the same container. Therefore, it is possible to control the drive level of the quartz vibrator and thus, there is effect that the DLD characteristics can be measured.

What is claimed is:

1. A piezo-oscillator comprising:
an oscillator circuit including a piezo-vibrator and an amplifier circuit, said piezo-vibrator being connected to an input of said amplifier circuit so that a frequency that is based upon resonance frequency of said piezo-vibrator is outputted from an output of said amplifier circuit,
a constant-voltage circuit connected to a power source, and
a first switch circuit that connects, by selection, either one of said power source and said constant-voltage circuit to said amplifier circuit; wherein
said first switch circuit
selects said constant-voltage circuit when a voltage to be supplied from said power source is equal to or lower than a predetermined value and
selects said power source when a voltage to be supplied from said power source is higher than said predetermined value.

2. A piezo-oscillator comprising:
an oscillator circuit including a piezo-vibrator and an amplifier circuit, said piezo-vibrator being connected to an input of said amplifier circuit so that a frequency that is based upon resonance frequency of said piezo-vibrator is outputted from an output of said amplifier circuit, a second switch circuit connected to a power source line for said amplifier circuit,
a constant-current circuit connected to said second switch circuit, and
a resistor connected to said second switch circuit; wherein said second switch circuit
connects said power source line and said constant-current circuit when a voltage to be supplied from a power source is equal to or lower than a predetermined value, and
connects said power source line and said resistor when a voltage to be supplied from said power source is higher than said predetermined value.

3. A piezo-oscillator comprising:
an oscillator circuit including a piezo-vibrator and an amplifier circuit, said piezo-vibrator being connected to an input of said amplifier circuit so that a frequency that is based upon resonance frequency of said piezo-vibrator is outputted from an output of said amplifier circuit,
a constant-voltage circuit connected to a power source, and
a frequency control voltage section connected to said piezo-vibrator, and
a first switch circuit that connects, by selection, either one of said power source and said constant-voltage circuit to said amplifier circuit; wherein
said first switch circuit
selects said constant-voltage circuit when a voltage to be supplied to said frequency control voltage section is equal to or lower than a predetermined value, and
selects said power source when a voltage to be supplied to said frequency control voltage section is higher than said predetermined value.

4. A piezo-oscillator comprising:
an oscillator circuit including a piezo-vibrator and an amplifier circuit, said piezo-vibrator being connected to an input of said amplifier circuit so that a frequency that is based upon resonance frequency of said piezo-vibrator is outputted from an output of said amplifier circuit,
a frequency control voltage section connected to said piezo-vibrator,
a second switch circuit connected to a power source line of said oscillator circuit,
a constant-current circuit connected to said second switch circuit, and
a resistor connected to said second switch circuit; wherein said second switch circuit
connects said power source line and said constant-current circuit when a voltage to be supplied to said frequency control voltage section is equal to or lower than a predetermined value, and
connects said power source line and said resistor when a voltage to be supplied to said frequency control voltage section is higher than said predetermined value.

5. The piezo-oscillator according to claim 3, wherein when a voltage supplied to said frequency control voltage section is higher than said predetermined value, a voltage of said power source is controlled, and a drive level of said piezo-vibrator is changed by changing a voltage to be supplied to said amplifier circuit.

6. The piezo-oscillator according to claim 4, wherein when a voltage supplied to said frequency control voltage section is higher than said predetermined value, a voltage of said power source is controlled, and a drive level of said piezo-vibrator is changed by changing a voltage to be supplied to said amplifier circuit.

7. The piezo-oscillator according to claim 5 or 6, wherein it is possible to examine drive level dependency characteristics of said piezo-vibrator by controlling a drive level of said piezo-vibrator.

8. A piezo-oscillator comprising:

an oscillator circuit including a piezo-vibrator and an amplifier circuit, said piezo-vibrator being connected to an input of said amplifier circuit so that a frequency that is based upon resonance frequency of said piezo-vibrator is outputted from an output of said amplifier circuit, a constant-voltage circuit connected to a power source, a first switch circuit or a second switch circuit, said first switch circuit connecting, by selection, either one of said power source and said constant-voltage circuit to said amplifier circuit, and said second switch circuit being connected to a power source line for said oscillator circuit, a constant-current circuit connected to said second switch circuit, and a resistor connected to said second switch circuit; wherein said first switch circuit selects said constant-voltage circuit when a voltage to be supplied from said power source is equal to or lower than a predetermined value, and selects said power source when a voltage to be supplied from said power source is higher than said predetermined value; or said second switch circuit connects said power source line and said constant-current circuit when a voltage to be supplied from said power source is equal to or lower than a predetermined value, and connects said power source line and said resistor when a voltage to be supplied from said power source is higher than said predetermined value.

9. The piezo-oscillator according to claim 6, wherein drive level dependency characteristics of said piezo-vibrator are examined by controlling a drive level of said piezo-vibrator.

10. The piezo-oscillator according to claim 1, wherein when said voltage to be supplied from said power source is higher than said predetermined value, a voltage to be supplied to said amplifier circuit is changed by controlling a voltage of said power source, thus changing a drive level of said piezo-vibrator.

11. The piezo-oscillator according to claim 1, wherein when said voltage to be supplied from said power source is higher than said predetermined value, a voltage to be supplied to said amplifier circuit is changed by controlling a voltage of said power source, thus changing a drive level of said piezo-vibrator.

12. The piezo-oscillator according to claim 10, wherein drive level dependency characteristics of said piezo-vibrator are examined by controlling said drive level of said piezo-vibrator.

13. The piezo-oscillator according to claim 11, wherein drive level dependency characteristics of said piezo-vibrator are examined by controlling said drive level of said piezo-vibrator.

* * * * *